United States Patent [19]

Look

[11] Patent Number: 4,578,529
[45] Date of Patent: Mar. 25, 1986

[54] FLAT PEELABLE CABLE

[75] Inventor: Raymond J. Look, Largo, Fla.

[73] Assignee: AMP Incorporated, Harrisburg, Pa.

[21] Appl. No.: 637,248

[22] Filed: Aug. 2, 1984

Related U.S. Application Data

[60] Continuation of Ser. No. 508,701, Jun. 28, 1983, which is a division of Ser. No. 332,271, Dec. 18, 1981, abandoned.

[51] Int. Cl.⁴ .............................................. H01B 7/08
[52] U.S. Cl. ................. 174/117 FF; 174/32; 174/117 A; 339/17 F
[58] Field of Search ......... 174/117 R, 117 F, 117 FF, 174/117 A, 32; 339/17 F, 99 R, 176 MF; 156/292

[56]     References Cited
U.S. PATENT DOCUMENTS

| | | | |
|---|---|---|---|
| 2,964,587 | 12/1960 | Minot | 174/117 |
| 3,173,991 | 3/1965 | Breakfield | 174/117 |
| 4,149,026 | 4/1979 | Fritz et al. | 174/32 |
| 4,154,977 | 5/1979 | Verma | 174/117 F |
| 4,381,420 | 4/1983 | Elliott et al. | 174/34 |
| 4,382,236 | 5/1983 | Suzuki | 333/1 |
| 4,478,778 | 10/1984 | Look | 174/32 |
| 4,490,690 | 12/1984 | Suzuki | 174/117 FF X |

FOREIGN PATENT DOCUMENTS 61309  3/1982  European Pat. Off. .

Primary Examiner—A. T. Grimley
Assistant Examiner—Morris H. Nimmo
Attorney, Agent, or Firm—Russell J. Egan; Robert W. Pitts

[57]     ABSTRACT

Process for manufacturing flat multi-conductor cable having two cable members and peelable internal lamina utilizes a pair of dies which simultaneously align conductors, laminate internal lamina, and extrude external lamina thereon. Each die has a conductor aligning surface with parallel linear conductor-receiving recesses therein and an adjacent extrusion surface. Conductors and internal lamina are drawn between aligning surfaces of mated dies and then between extrusion surfaces where vinyl is extruded through an aperture in each die to form external lamina. A knife-edged die insert adjacent one side of the aligning and extrusion surfaces provides a V-notch in one edge of the cable to facilitate peeling apart cable members for termination to a two-sided connector.

4 Claims, 7 Drawing Figures

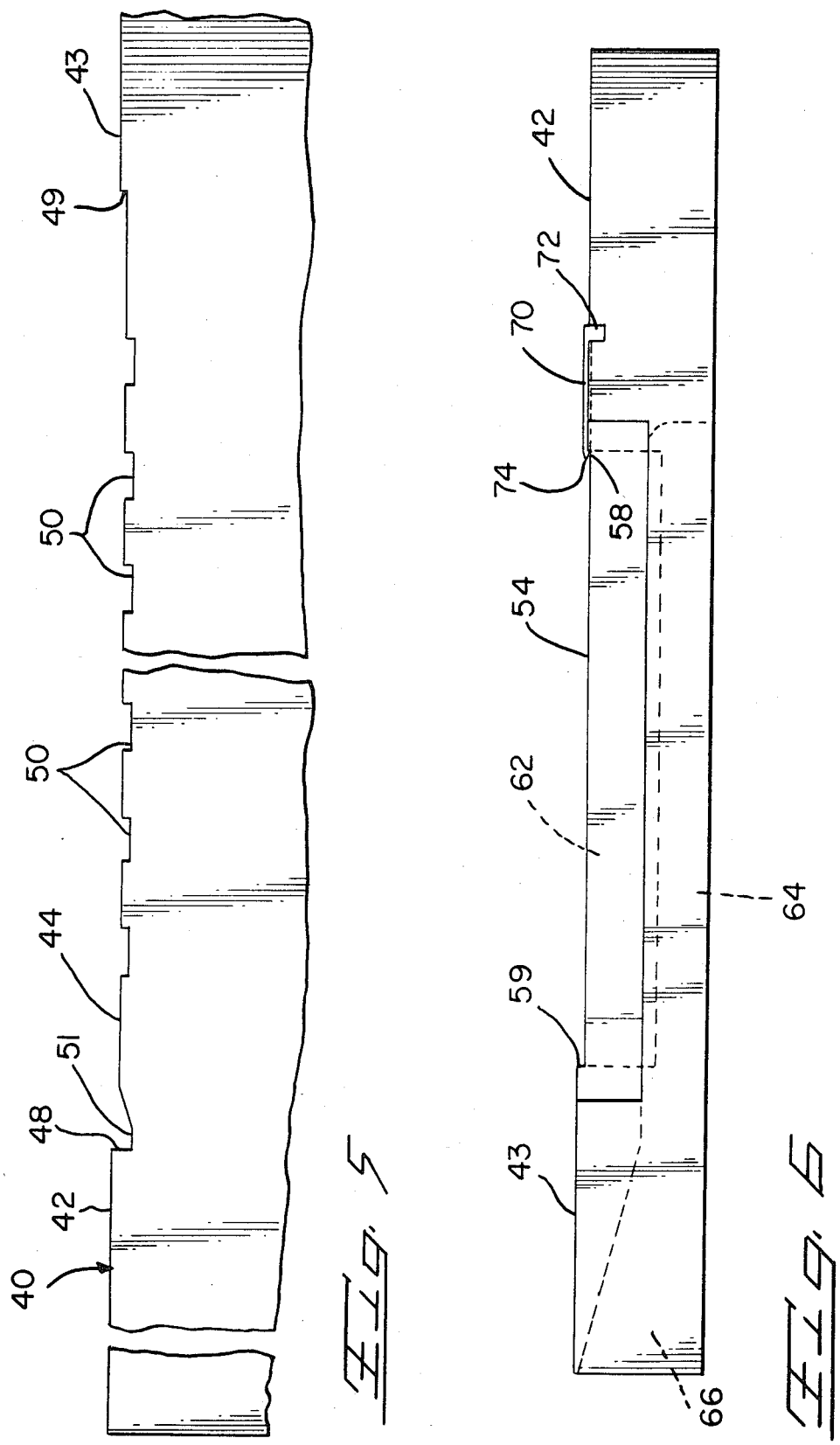

FLAT PEELABLE CABLE

CROSS REFERENCE TO RELATED APPLICATION

This application is a continuation of application Ser. No. 508,701 filed June 28, 1983 which is in turn a division of application Ser. No. 332,271 filed Dec. 18, 1981 and now abandoned.

BACKGROUND OF THE INVENTION

The present invention relates to a flat multi-conductor cable, particularly a cable comprising two peelable flat cable members.

There is described in U.S. Pat. No. 4,149,026 a flat multi-conductor cable of the type comprising two flat cable members laminated together with two internal lamina of flexible material therebetween to form cable members which are secured together by an adhesive (FIG. 5). In order to accomplish this, the patent contemplates bonding the interior surfaces together by lines or dots of adhesive, or alternatively by selectively applying heat to the cable. These methods require the application of an adhesive, and somewhat complicate the manufacture. Further, where flat cable members are manufactured separately and subsequently bonded together, closely controlled spacing between conductors in adjacent cables is difficult to maintain.

SUMMARY OF THE INVENTION

The flat multi-conductor cable of the present invention comprises two flat multi-conductor cable members formed together. Each cable member has an internal lamina peelably bonded to the internal lamina of the adjacent cable to form a dielectric layer between two planes of conductors. A V-notch is provided in the edge of the cable to facilitate peeling the cable members apart for termination to a connector having two opposed rows of terminals. The dies used have an aligning section for the internal lamina and conductors and an extrusion section for applying external layers, thereby providing means for simultaneously laminating and extruding components to form the completed cable. The process and apparatus for practicing same assure a controlled spacing of individual conductors in each cable member, and a controlled spacing between conductors of adjacent cable members.

These and other features will be apparent with reference to the drawings and description which follow.

BRIEF DESCRIPTION OF THE DRAWINGS

FIG. 5 is an end view of the lower extrusion die.

FIG. 6 is an end view of the lower extrusion die.

DETAILED DESCRIPTION OF THE PREFERRED EMBODIMENT

Figure 1:
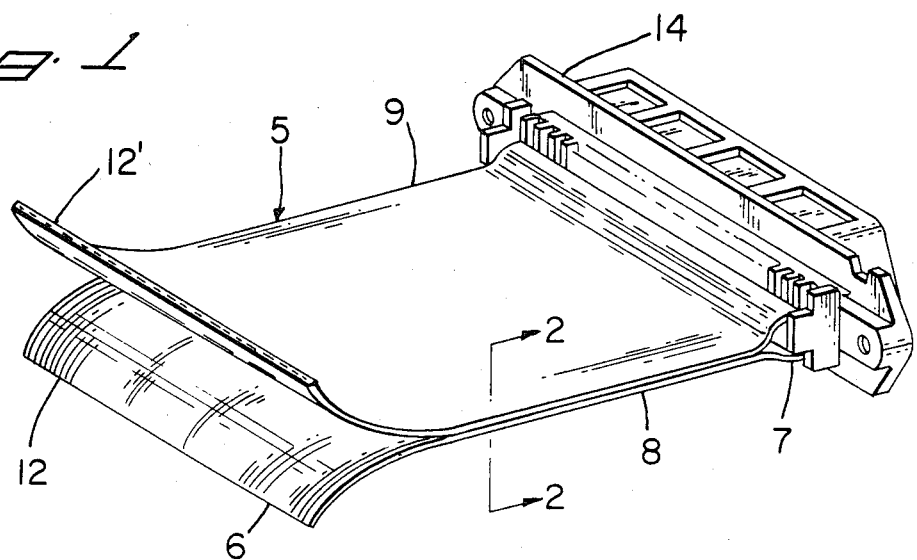
FIG. 1 is a perspective of the cable as terminated to a two-row connector.

FIG. 1 depicts a flat twenty-five-pair communication cable 5 as terminated to a two-row insulation displacing connector 14 of the type described in U.S. Pat. No. 3,760,335. A section of cable 5 is shown peeled apart to separate first cable member 12 from second cable member 12' at first end 6 and second end 7, which is attached to the connector 14. Each cable member 12, 12' has the insulation removed from a strip proximate the second end 7 thereof to expose the conductors 24, 24' as described in U.S. Pat. No. 4,160,573. This leaves a strip of insulation on the very end of the cable members 12, 12' to maintain the alignment of the conductors 24, 24' for proper registration with the electrical contacts in the connector 14. The cable 5 is laterally bounded by a first edge 8 and a second edge 9, and is of the general type described in U.S. Pat. No. 4,149,026, which is hereby incorporated by reference.

Figure 2:
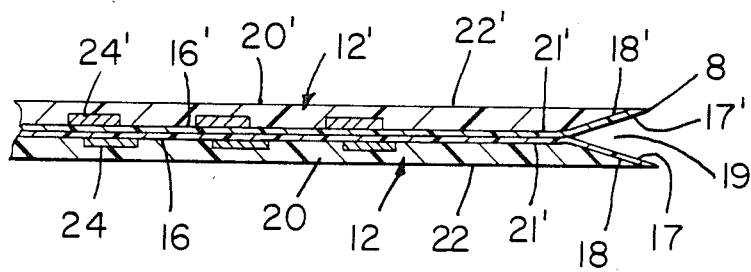
FIG. 2 is a cross section of the cable.

FIG. 2 depicts a cross section of the cable 5. The two cable members 12, 12' are separated by a pair of flexible dielectric internal laminas 16, 16' sandwiched therebetween. Each internal lamina 16, 16' has a respective first surface 17, 17' and a respective second surface 18, 18'. The first surfaces 17, 17' are bonded together, as will be described, and the opposed second surfaces 18, 18' are bonded to respective cable members 12, 12' as will be described. The cable members 12, 12' consist of respective external layers 20, 20' each having respective first surfaces 21, 21' and respective outer or second surfaces 22, 22'. The first surfaces 21, 21' have conductors 24, 24' embedded therein; the conductors 24, 24' are flat with a rectangular profile and are embedded in the respective external layers 20, 20' so that one surface of each conductor 24, 24' is flush with the respective first surface 21, 21' of the cable member. The conductors 24 are aligned in parallel in the cable member 12, and are preferably situated with the centers slightly offset from the conductors 24' in cable 12' as taught by U.S. Pat. No. 4,149,026. This minimizes crosstalk in telephone cable applications.

The cable 5 of the present invention exhibits the desirable property of peelability of the internal laminas 16, 16'. This property is made possible by having the internal laminas 16, 16' bonded to the respective cable members 12, 12' with greater adhesion than the internal laminas 16, 16' are bonded to each other. While this could be done by using different adhesives, it is most desirable from a standpoint of cost and convenience to use the same adhesive on both surfaces. It has been found that certain adhesives, when applied to certain surfaces, will adhere to a dissimilar surface more readily than they will adhere to themselves, in the fashion of many adhesive tapes. This property, combined with the property of not re-adhering or exhibiting stickiness when separated, is most desirable for a two-layer transmission cable, so that the component cable members can be separated without disturbing the insulation on the conductors. A suitable product is Melinex type 505, a trademark of ICI Americas, Inc. of Wilmington, Del. Melinex type 505 is a biaxially oriented polyethylene terephthalate (polyester) film, pretreated to promote adhesion. The polyester film is clear and smooth in appearance and is capable of withstanding temperatures of 375° F., at which temperature surface adhesion is effected.

Figure 3:
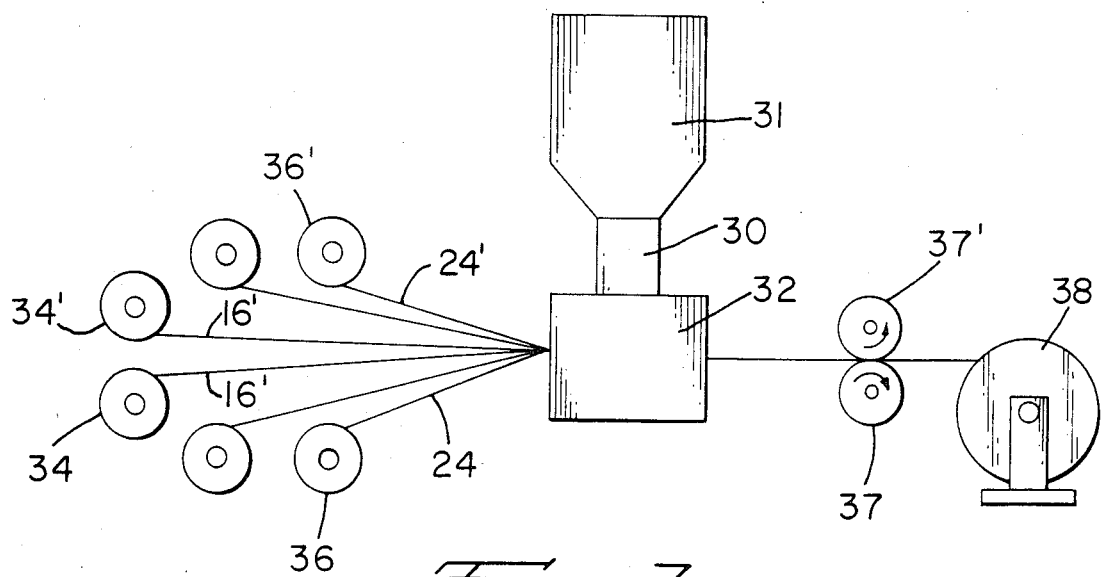
FIG. 3 is schematic of the manufacturing apparatus.

The cable described above is manufactured by a combination lamination and extrusion process as depicted schematically in FIG. 3. The internal laminas 16, 16' are drawn from rolls 34, 34' respectively through die housing 32 where the external lamina 20, 20' are extruded thereon. The conductors 24, 24' are drawn from rolls 36, 36' through the die housing 32 with internal laminas 16, 16' by tractor rollers 37, 37'. Only two supply rolls 36, 36' are shown, but one roll is necessary for each conductor in the finished cable 5. Thus, for twenty-five pair cable, a staggered field of fifty feed rolls is necessary to provide the copper conductors. The 25 pairs of conductors 24, 24' are aligned in extruding dies as will be described and vinyl pellets for extrusion to form the external layers 20, 20' are fed into extruder 30 from bin 31. Finished cable 5 is collected on reel 38.

Figure 4:
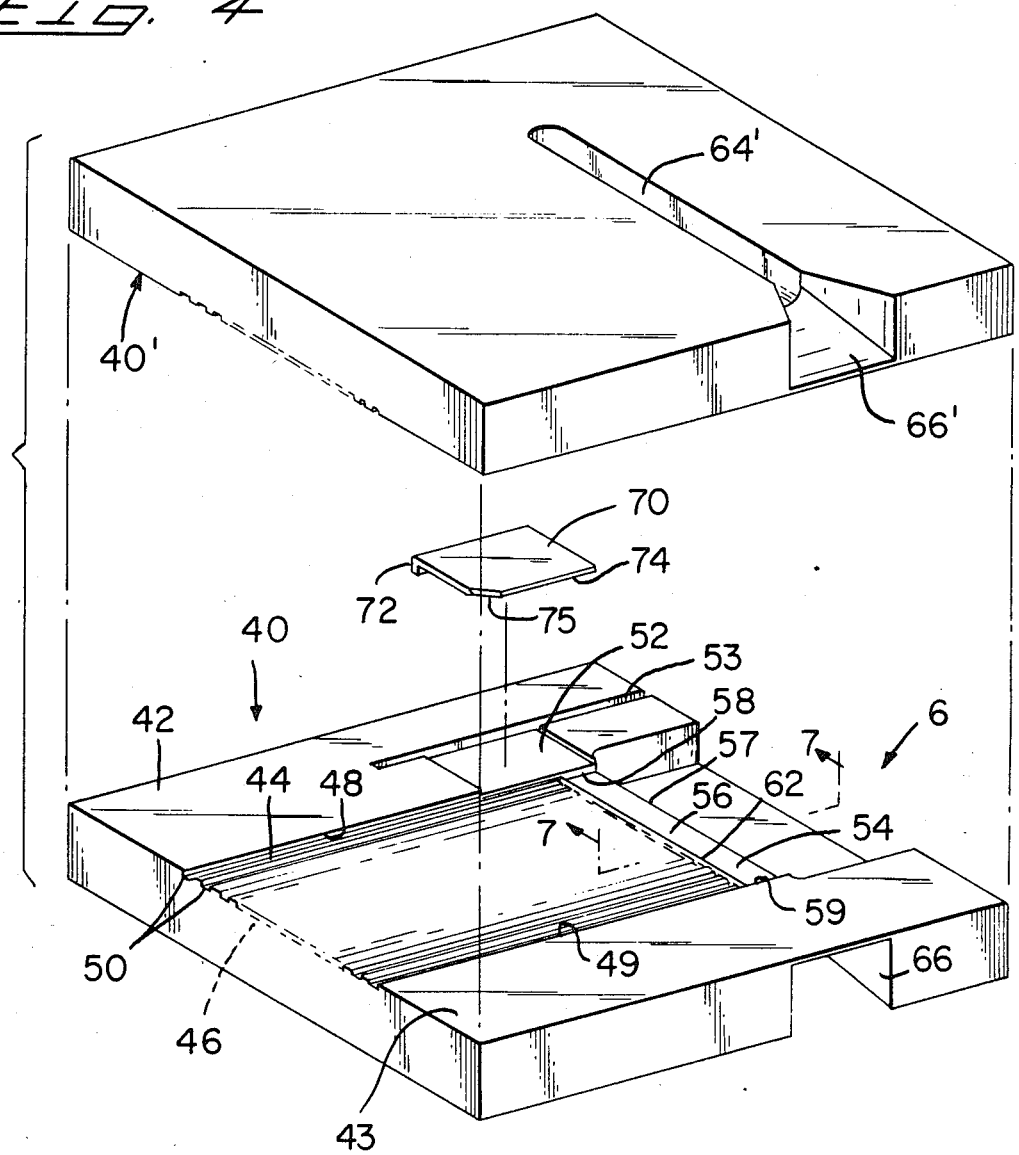
FIG. 4 is a perspective of the extrusion dies.

FIG. 4 is a perspective of upper and lower extruding dies 40, 40'. The upper die 40' is essentially the mirror image of lower die 40, so it may be assumed that features of the upper die 40', denoted by prime numbers corresponding to unprimed numbers in the lower die 40, are similar unless otherwise noted. The lower die 40 has a flat conductor aligning surface 44 which is recessed from flat coplanar mating surfaces 42, 43 which fit snugly against similar surfaces in upper die 40'. The aligning surface 44 is flanked by parallel, opposed first and second sidewalls 48, 49 which serve to recess the surface 44 from mating surfaces 42, 43. The aligning surface 44 is profiled with a plurality of parallel linear recesses 50, each being rectangular in cross section and profiled to closely receive a flat conductor 24 so it is flush with the aligning surface 44. Each linear recess 50 extends from an open first end 46 to an open second end 47 of the aligning surface 44. A flat extruding surface 54 adjacent to surface 44 is recessed slightly further from the mating surfaces 42, 43 than the aligning surface 44 and is flanked by first and second sidewalls 58, 59 which are contiguous and coplanar with sidewalls 48, 49 respectively. A linear aperture 62 extends between the sidewalls 58, 59 between the second end 47 of aligning surface 44 and the first end 56 of extruding surface 54, which has an open second end 57 opposite first end 56. The linear aperture 62 is connected to a reservoir 64, visible as reservoir 65' in upper die 40', which communicates with inlet 66 in the edge of the die 40. The reservoirs 64, 64' fit against flat surfaces inside the die housing 32 (FIG. 3) to form closed channels which communicate with inlets 56, 56'. The extruder 30 (FIG. 3) provides extrusive hot melt to the inlets 66, 66' for extrusion of the outer layers 20, 20' via apertures 62, 62'.

Referring still to FIG. 4, the mating surface 42 has an insert recess 52 which is profiled to receive die insert 70 so that leg 72 of insert 70 fits in slot 53 adjacent recess 52 and knife edge 74 protrudes slightly beyond sidewalls 48, 58, as will be more readily apparent with reference to FIG. 6. Note that there is no slot in die 40' which corresponds to slot 53'.

FIG. 5 is an end view of die 40 facing the first end 46 of aligning surface 44. The linear recesses 50 number twenty-five total in each die 40, 40' for a twenty-five pair communication cable. The surface 44 is flanked by sidewalls 48, 49 which have a depth roughly equivalent to the thickness of an internal lamina 16. Note that surface 44 has an edge recess 51 adjacent first sidewall 48. The recesses 51, 51' permit some separation between internal laminas 16, 16' as they are drawn between aligning surfaces 44, 44' and past knife edge 74.

Figure 7:
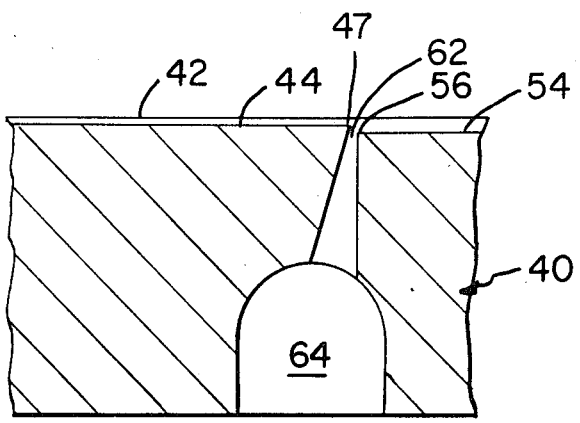
FIG. 7 is a section view of the aperture between the reservoir and extrusion section.

FIG. 6 is an end view of die 40 facing the second end 57 of extruding surface 54. Here the die insert 70 is shown in place in recess 52 in mating surface 42. Note that knife edge 74 protrudes slightly beyond sidewall 58 to effect edge separation of laminas 16, 16' in the finished cable. The extruding inlet 66, reservoir 64, and linear aperture 62 are also visible in phantom in this view; these features are shown in more detail in the cross section of FIG. 7. FIG. 7 clearly shows the depth differential between aligning surface 44 and extruding surface 54; this differential is the same as the thickness of the extruded vinyl in external layer 20 between the first surface 21 and the second surface 22. The total depth of extruding surface 54 below mating surface 42 is the same as the total thickness of a cable member 12.

The manufacturing process described briefly in conjunction with FIG. 3 will now be described in more detail in conjunction with various drawings. First the internal laminas 16, 16' are fed between the assembled dies 40, 40', then the conductors 24, 24' are aligned in the linear recesses 50, 50' and fed between the dies 40, 40'. The dies 40, 40' are heated to about 375° F., and the conductors 24, 24' and internal laminas 16, 16' are then drawn through the dies by tractor rolls 37, 37'. The extruder 30 (FIG. 3) is then activated and the vinyl pellets are extruded through apertures 62, 62' to form the external lamina 20, 20'. The complete cable 5 is drawn through the tractor rolls 37, 37' continuously with conductor/internal lamina starter section which is subsequently trimmed. The heat is sufficient to initiate some bonding of the internal laminas 16, 16' between the aligning surfaces 44, 44' as well as some adherence of linear conductors 24, 24' to second surfaces 18, 18', but the 100 psi pressure exerted by the vinyl melt being extruded through apertures 62, 62' assures good adhesion of all surfaces in contact with internal laminas 16, 16'.

The above described process, apparatus, and materials are the preferred means of manufacturing a peelable twenty-five pair cable of the type described in U.S. Pat. No. 4,149,026. The foregoing description is not intended to limit the scope of the claims which follow.

I claim:

1. A flat multiconductor cable of the type having two adjacent cable members separated by dielectric internal laminas a plurality of flat parallel linear conductors of each said cable member being disposed against respective sides of each said internal lamina and having a precise spacing between adjacent conductors in each cable member as well as between superposed transversely offset conductors of said adjacent cables members through the length of said cable, said conductors having been adhered to each said internal lamina while being drawn through aligning means with said internal laminas;

two said dielectric internal laminas with continuous bonding therebetween separating said cable members, each said internal lamina has a first surface and a second surface, said first surfaces being juxtaposed, said second surfaces being disposed against respective cable members, said internal laminas having continuous bonding between said first surfaces thereof and continuous bonding between the second surfaces thereof and adjacent cable members, said continuous bonding between said second surfaces of said internal laminas and said cable members providing greater adhesion than the bonding between the first surfaces of said internal laminas, whereby the cable members may be separated by peeling apart the first surfaces of said internal laminas without disturbing the bonding between the internal laminas and the adjacent cable members; and a dielectric external layer disposed against each said internal lamina to overlie and enclose said conductors, said external layers having been extruded against said conductors and said internal laminas.

2. The cable of claim 1 wherein said continuous bonding is accomplished by a heat activated adhesive.

3. The cable of claim 1 wherein one edge thereof has a V-notch between the first surfaces of said internal laminas to facilitate peeling apart said cable members.

4. A flat multiconductor cable of the type having two adjacent cable members separated by dielectric internal laminas,
   a plurality of flat parallel linear conductors of each said cable member being disposed against respective sides of each said internal lamina and having a precise spacing between adjacent conductors in each cable member, said conductors having been adhered to each said internal lamina while being drawn through aligning means with said internal laminas;
   two said dielectric internal laminas with continuous bonding therebetween separating said cable members, each said internal lamina has a first surface and a second surface, said first surfaces being juxtaposed, said second surfaces being disposed against respective cable members, said internal laminas having continuous bonding between said first surfaces thereof and continuous bonding between the second surfaces thereof in adjacent cable members, said continuous bonding between said second surfaces of said internal laminas and said cable members providing greater adhesion than the bonding between the first surfaces of said internal laminas, whereby the cable members may be separated by peeling apart the first surfaces of said internal laminas without disturbing the bonding between the internal laminas and the adjacent cable members; and
   a dielectric external layer disposed against each said internal lamina to overlie and enclosed said conductors, said external layers having been extruded against said conductors and said internal laminas.

* * * * *